(12) United States Patent
Lin et al.

(10) Patent No.: US 11,317,039 B1
(45) Date of Patent: Apr. 26, 2022

(54) IMAGE-SENSING DEVICE

(71) Applicant: VisEra Technologies Company Limited, Hsin-Chu (TW)

(72) Inventors: Kuo-Feng Lin, Kaohsiung (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 17/142,826

(22) Filed: Jan. 6, 2021

(51) Int. Cl.
*H04N 5/353* (2011.01)
*H04N 5/369* (2011.01)
*G03H 1/30* (2006.01)
*H04N 9/04* (2006.01)

(52) U.S. Cl.
CPC ............ *H04N 5/3535* (2013.01); *G03H 1/30* (2013.01); *H04N 5/36961* (2018.08); *H04N 9/0455* (2018.08); *G03H 2223/15* (2013.01); *G03H 2240/11* (2013.01)

(58) Field of Classification Search
CPC ............ H04N 5/3535; H04N 5/36961; H04N 9/0455; G03H 1/30
USPC .......................................................... 348/41
See application file for complete search history.

(56) References Cited

U.S. PATENT DOCUMENTS

2013/0100333 A1 4/2013 Awatsuji et al.
2019/0041794 A1* 2/2019 Lin ...................... G03H 1/0443

OTHER PUBLICATIONS

Hiroyuki Toge et al:"One-shot digital holography for recording color 3-D images", Proceedings of SPIE, vol. 6912, Feb. 7, 2008 (Feb. 7, 2008), pp. 69120U-69120U-8, XP055113565.

* cited by examiner

*Primary Examiner* — Jeffery A Williams
(74) *Attorney, Agent, or Firm* — Muncy, Geissler, Olds & Lowe, P.C.

(57) ABSTRACT

An image-sensing device includes photoelectric elements for receiving incident light. The photoelectric elements are arranged into unit cells, and each of the unit cells includes a first, a second, a third and a fourth photoelectric element. The first, the second, the third and the fourth photoelectric elements in each of the unit cells are formed of pillar structures, and the first, the second, the third and the fourth photoelectric elements are different sizes. The first photoelectric element captures a first image in a first phase, the second photoelectric element captures a second image in a second phase, the third photoelectric element captures a third image in a third phase, and the fourth photoelectric element captures a fourth image in a fourth phase. The first phase, the second phase, the third phase, and the fourth phase are different.

15 Claims, 10 Drawing Sheets

IMAGE-SENSING DEVICE

TECHNICAL FIELD

The disclosure relates to an image-sensing device.

BACKGROUND

With advances being made in technology, electronic devices equipped with a camera have become very popular. However, a modular lens in a conventional camera, a.k.a. a color image sensing (CIS) device, is generally an essential component for capturing incoming light and converting this captured light into digital images. However, due to the limitations of conventional imaging techniques, an image is formed with a lens, and a modular lens takes up a large portion of the available space within the camera. Since the size of portable electronic devices has become smaller and smaller, a large-sized modular lens is not appropriate for these devices.

Accordingly, there is demand for a lens-free image sensor to reduce the size of the camera.

SUMMARY

The disclosure provides an image-sensing device, which includes a plurality of photoelectric elements for receiving incident light. The photoelectric elements are arranged into a plurality of unit cells, and each of the unit cells includes a first photoelectric element, a second photoelectric element, a third photoelectric element, and a fourth photoelectric element. The first photoelectric element, the second photoelectric element, the third photoelectric element, and the fourth photoelectric element in each of the unit cells are formed of pillar structures, and the first photoelectric element, the second photoelectric element, the third photoelectric element, and the fourth photoelectric element are all different sizes. The first photoelectric element in each of the unit cells captures a first image in a first phase, the second photoelectric element in each of the unit cells captures a second image in a second phase, the third photoelectric element in each of the unit cells captures a third image in a third phase, the fourth photoelectric element in each of the unit cells captures a fourth image in a fourth phase. The first phase, the second phase, the third phase, and the fourth phase are different.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSED EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, a person skilled in the art would selectively implement all or some technical features of any embodiment of the disclosure or selectively combine all or some technical features of the embodiments of the disclosure.

In each of the following embodiments, the same reference number represents the same or similar element or component.

Figure 1:
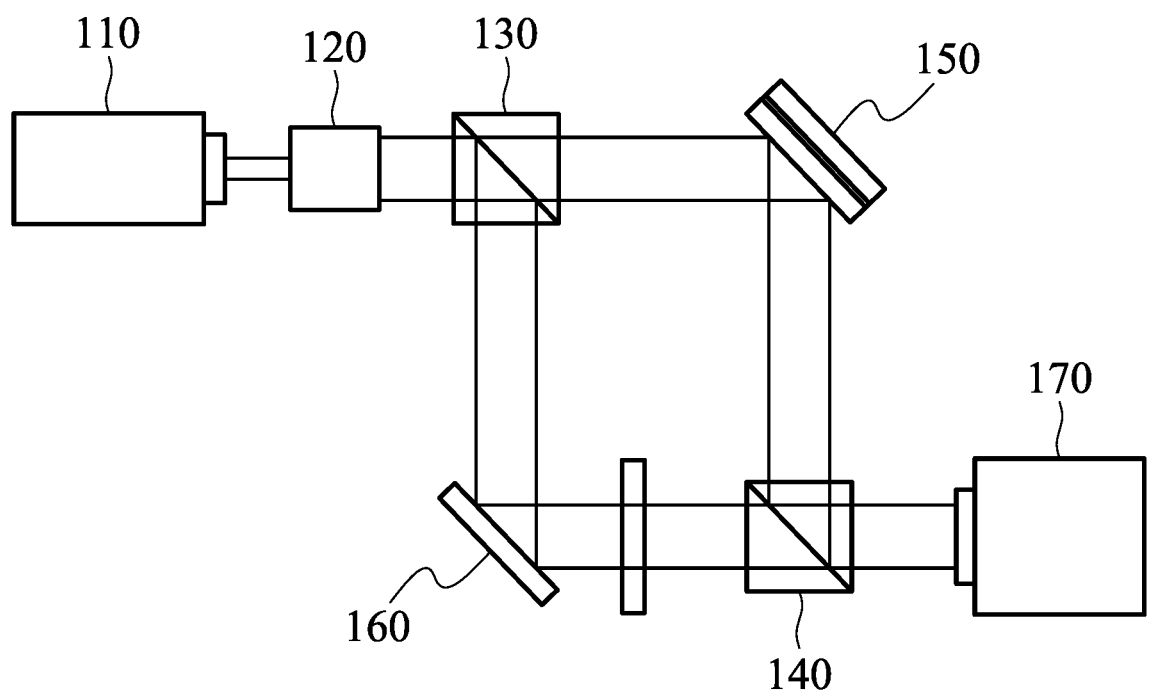
FIG. 1 is a schematic diagram of a phase-shifting digital holography device.

FIG. 1 is a schematic diagram of a phase-shifting digital holography device. Please refer to FIG. 1. The phase-shifting digital holography device 100 includes a laser light source 110, a beam emitter 120, beam splitters 130 and 140, a piezoelectric transducer (PZT) mirror 150, a mirror 160, and a sensor array 170. The laser light that emitted from the laser light source 110 is further enhanced at the beam emitter 120, and the light emitted from the beam emitter 120 is split into an object light and a reference light by the beam splitter 130. The reference light is reflected by the PZT mirror 150 that phase modulates the beam. By shifting a constant phase to the reference beam, different hologram images are obtained to derive the complex amplitude of the object wave.

For example, the initial phase of the reference wave is zero and changes by $\pi/2$ at each step. Assuming a 4-step phase-shifting digital holography algorithm is used and the intensity of the interference patterns at different phases such as $0$, $\pi/2$, $\pi$, and $3\pi/2$ may be respectively expressed in the formulas (1)-(4):

$$I_0 = |\psi_0|^2 + |\psi_r|^2 + \psi_0\psi_r^* + \psi_0^*\psi_r \quad (1)$$

$$I_{\pi/2} = |\psi_0|^2 + |\psi_r|^2 + j\psi_0\psi_r^* - j\psi_0^*\psi_r \quad (2)$$

$$I_\pi = |\psi_0|^2 + |\psi_r|^2 + \psi_0\psi_r^* - \psi_0^*\psi_r \quad (3)$$

$$I_{3\pi/2} = |\psi_0|^2 + |\psi_r|^2 - j\psi_0\psi_r^* + j\psi_0^*\psi_r \quad (4)$$

After obtaining the intensity of the interference patterns at phases $0$, $\pi/2$, $\pi$, and $3\pi/2$, the complex amplitude of the object light is given by the following formula (5):

$$\psi_0 = \frac{(I_0 - I_\pi) - j(I_{\pi/2} - I_{3\pi/2})}{4\psi_r^*} \quad (5)$$

The complex amplitude of the object light is sometimes referred to as the complex hologram image because we may retrieve the amplitude distribution of the object light in the object plane from $\psi_0$ by performing digital back-propagation.

Accordingly, the complex amplitude of the reference light must be known in order to calculate object waves. Usually, the reference light is a plane wave or a spherical wave and therefore its phase is known without any measurement. One having ordinary skill in the art will appreciate the techniques for reconstructing an object image using object waves at different phases, and thus the details will be omitted here.

It should be noted that the phase-shifting digital holography device 100 described in the example of FIG. 1 has to change phase at each step, and it takes time to change phase, calculate the intensities of interference patterns, and reconstruct the object image. Accordingly, it is not practical to employ the device 100 in any portable electronic devices currently being sold on the market.

Figure 2A:
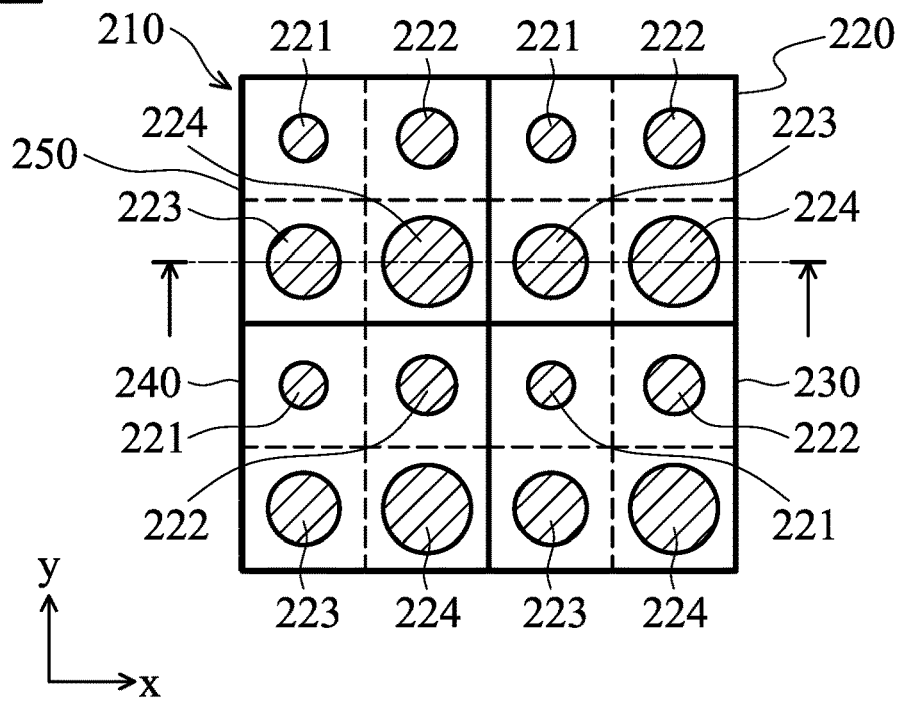
FIG. 2A is a top view of an image-sensing device according to an embodiment of the disclosure.
Figure 3:
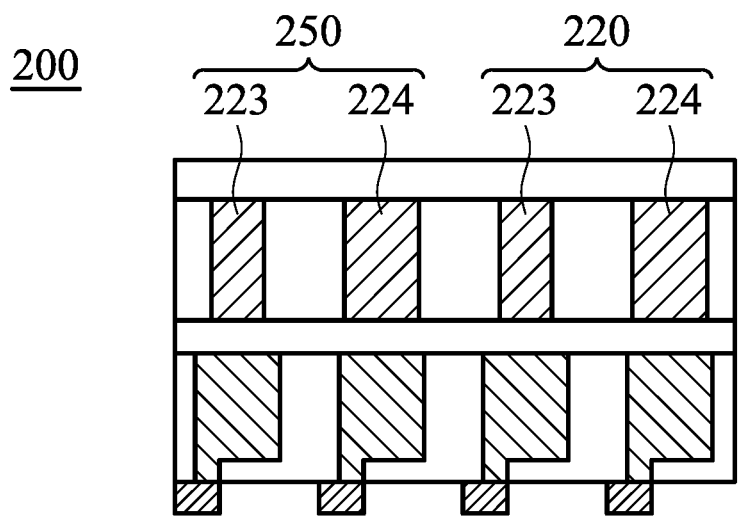
FIG. 3 is a cross-sectional view of the image-sensing device in FIG. 2A.

However, the concept of phase delay of the phase-shifting digital holography algorithm may be used in an image-sending device of the disclosure. FIG. 2A is a top view of an image-sensing device according to an embodiment of the disclosure. FIG. 3 is a cross-sectional view of the image-sensing device in FIG. 2A. In the embodiment, the image-sensing device 200 is, for example, a mono-color image sensor. Please refer to FIG. 2A and FIG. 3. The image-sensing 200 may include a sensor array 210. The sensor array 210 includes a plurality of photoelectric elements for receiving incident light. The photoelectric elements may be implemented on a substrate 250 (as shown in FIG. 3) via semiconductor manufacturing processes. It should be noted that no lens is used in the image-sensing device 200.

In the sensor array 210, the photoelectric elements are arranged into a plurality of unit cells 220, 230, 240 and 250. For example, each of unit cells 220, 230, 240 and 250 includes a photoelectric element 221, a photoelectric element 222, a photoelectric element 223 and a photoelectric element 224, and the photoelectric element 221, the photoelectric element 222, the photoelectric element 223 and the photoelectric element 224 are arranged into a 2×2 array.

Furthermore, the photoelectric element 221, the photoelectric element 222, the photoelectric element 223 and the photoelectric element 224 in each of the unit cells 220, 230, 240 and 250 are formed of pillar structures. In the embodiment, materials of the pillar structures are, for example, single crystal silicon, polycrystalline silicon (poly Si), amorphous silicon, $Si_3N_4$, GaP, $TiO_2$, AlSb, AlAs, AlGaAs, AlGaInP, BP, $ZnGeP_2$, any other applicable material, or a combination thereof, but the embodiment of the disclosure is not limited thereto.

In addition, the photoelectric element 221, the photoelectric element 222, the photoelectric element 223 and the photoelectric element 224 are different sizes. For example, the size of the photoelectric element 221 is less than the size of the photoelectric element 222. The size of the photoelectric element 222 is less than the size of the photoelectric element 223. The size of the photoelectric element 223 is less than the size of the photoelectric element 224.

Furthermore, the photoelectric element 221, the photoelectric element 222, the photoelectric element 223 and the photoelectric element 224 may be different diameters, and the diameter of each of the photoelectric element 221, the photoelectric element 222, the photoelectric element 223 and the photoelectric element 224 represents a specific phase of a corresponding phase-shifting hologram image.

Figure 4:
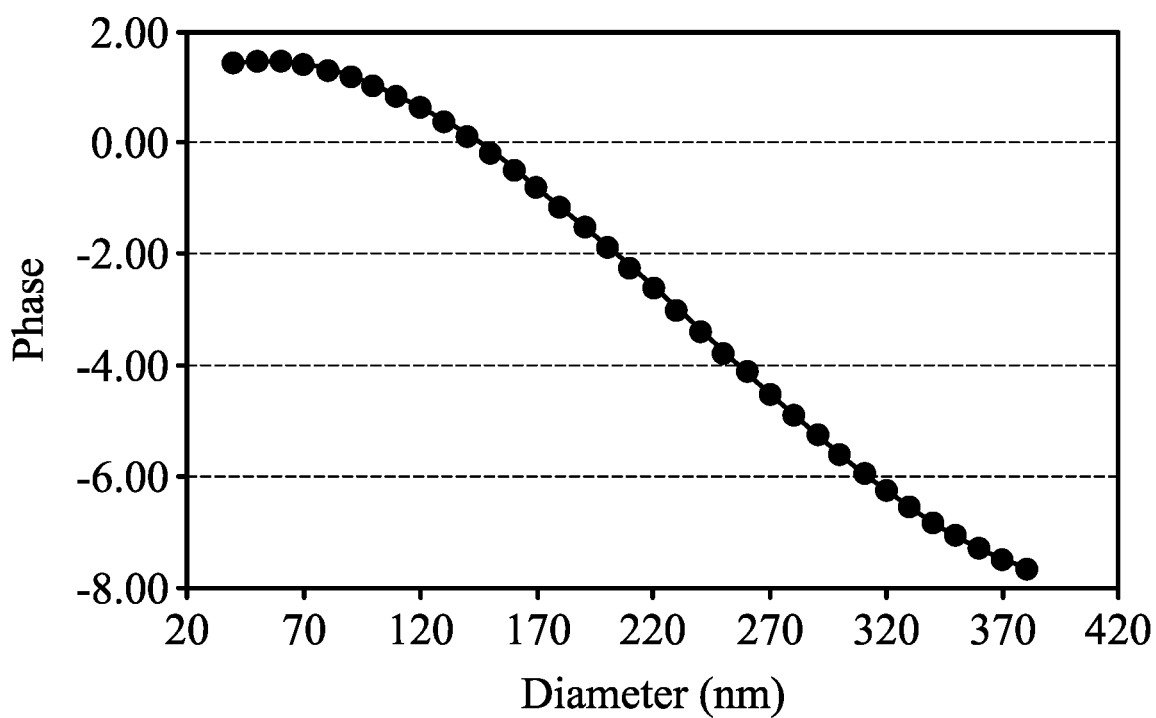
FIG. 4 is a schematic diagram of a corresponding relationship of the diameters of the photoelectric elements and the phases according to an embodiment of the disclosure.

Specifically, a 4-step phase-shifting holography method is employed into the architecture of the image-sensing device 200. For example, the diameters of the photoelectric element 221, the photoelectric element 222, the photoelectric element 223 and the photoelectric element 224 are d0, d1, d2, and d3 that correspond to the phase $\delta 0$, the phase $\delta 1$, the phase $\delta 2$, and the phase $\delta 3$, respectively. The values of the phase $\delta 0$, the phase $\delta 1$, the phase $\delta 2$, and the phase $\delta 3$ are, for example 0, $\pi/2$, $\pi$, and $3\pi/2$, respectively. In the embodiment, a corresponding relationship of the diameters of the photoelectric elements and the phases is as shown in FIG. 4. In addition, diameters of the photoelectric element 221, the photoelectric element 222, the photoelectric element 223 and the photoelectric element 224 are, for example, 120-350 nm, and heights of the photoelectric element 221, the photoelectric element 222, the photoelectric element 223 and the photoelectric element 224 are, for example, 300-750 nm.

It should be noted that the unit cell 220 is repeatedly arranged in the sensor array 210, and each of the photoelectric element 221, the photoelectric element 222, the photoelectric element 223 and the photoelectric element 224 in each of unit cells 220, 230, 240 and 250 may capture an image in an individual phase of four different phases. For example, the photoelectric element 221 in each of the unit cells 220, 230, 240 and 250 captures a first image in a first phase (such as the phase $\delta 0$), the photoelectric element 222 in each of the unit cells 220, 230, 240 and 250 captures a second image in a second phase (such as the phase $\delta 1$), the photoelectric element 223 in each of the unit cells 220, 230, 240 and 250 captures a third image in a third phase (such as the phase $\delta 2$), the photoelectric element 224 in each of the unit cells 220, 230, 240 and 250 captures a fourth image in a fourth phase (such as the phase $\delta 3$).

Since the first image, the second image, the third image, and the fourth image are captured by the photoelectric element 221, the photoelectric element 222, the photoelectric element 223 and the photoelectric element 224 in each of the unit cells 250, and thus the locations of the first image, the second image, the third image, and the fourth image are substantially the same. For example, the phase-shifting hologram image for the phase $\delta 0$ may be obtained from the captured image of the photoelectric element 221 in each of unit cells 220, 230, 240 and 250. Similarly, the phase-shifting hologram image for the phase $\delta 1$, the phase $\delta 2$, and the phase $\delta 3$ may be obtained from the captured image of the photoelectric element 222, the photoelectric element 223 and the photoelectric element 224 in each of the unit cells 220, 230, 240 and 250, respectively.

After obtaining phase-shifting hologram images in four phases, the object wave in the Fourier domain may be obtained using formula (5). Subsequently, an inverse Fourier transform is performed on the object wave to reconstruct the object image in the spatial domain. Alternatively, a transfer function H(x, y) for transforming the object wave in the Fourier domain to the object image in the spatial domain may be estimated in advance, and thus a convolution between the object wave and the transfer function may be performed to obtain the object image.

In the embodiment, each of the unit cells 220, 230, 240 and 250 is formed as a 2×2 array, an order of the first photoelectric element 221, the second photoelectric element 222, the third photoelectric element 223 and the fourth photoelectric element 224 in the 2×2 array is fixed, and an order of each of unit cells 220, 230, 240 and 250 is fixed, as shown in FIG. 2A. Therefore, patterns formed by the unit cells 220, 230, 240 and 250 may be the same. However, the embodiment of the disclosure is not limited thereto.

Figure 2B:
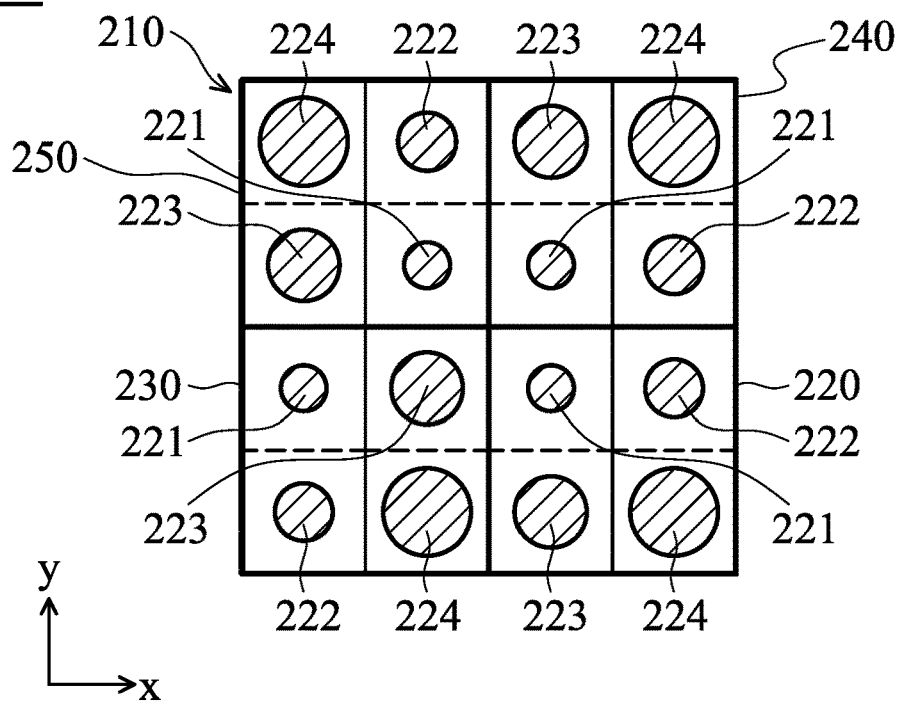
FIG. 2B is a top view of an image-sensing device according to another embodiment of the disclosure.

In some embodiments, each of the unit cells 220, 230, 240 and 250 is formed as a 2×2 array, an order of the first photoelectric element 221, the second photoelectric element 222, the third photoelectric element 223 and the fourth photoelectric element 224 in the 2×2 array is flexible, and an order of each of the unit cells 220, 230, 240 and 250 is flexible, as shown in FIG. 2B. Therefore, patterns formed by the unit cells 220, 230, 240 and 250 may be different.

Figure 5:
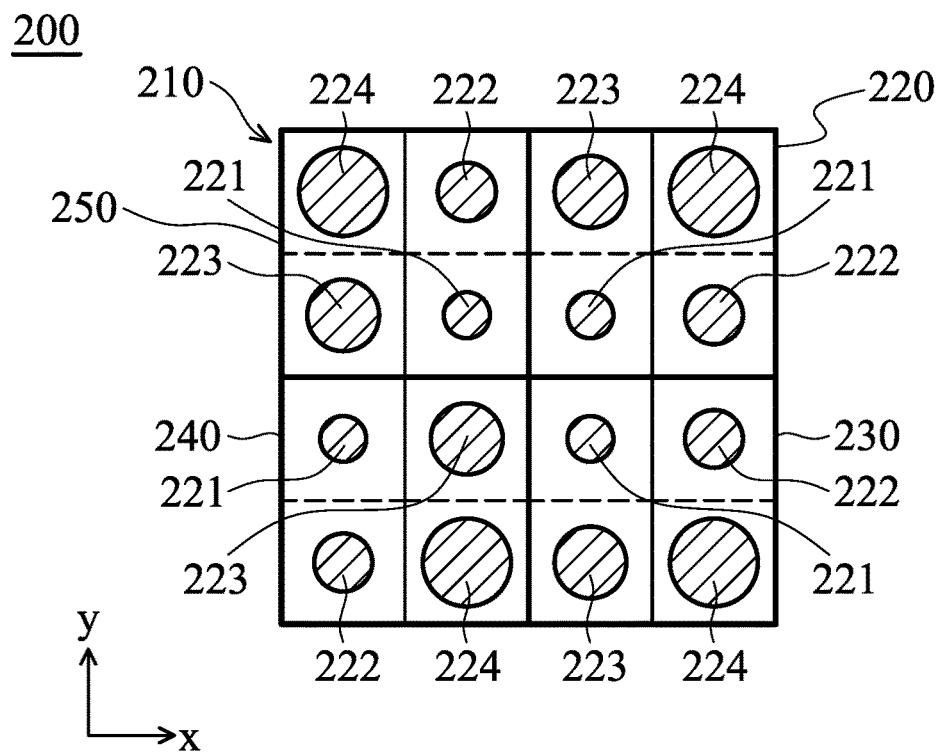
FIG. 5 is a top view of an image-sensing device according to another embodiment of the disclosure.
Figure 6:
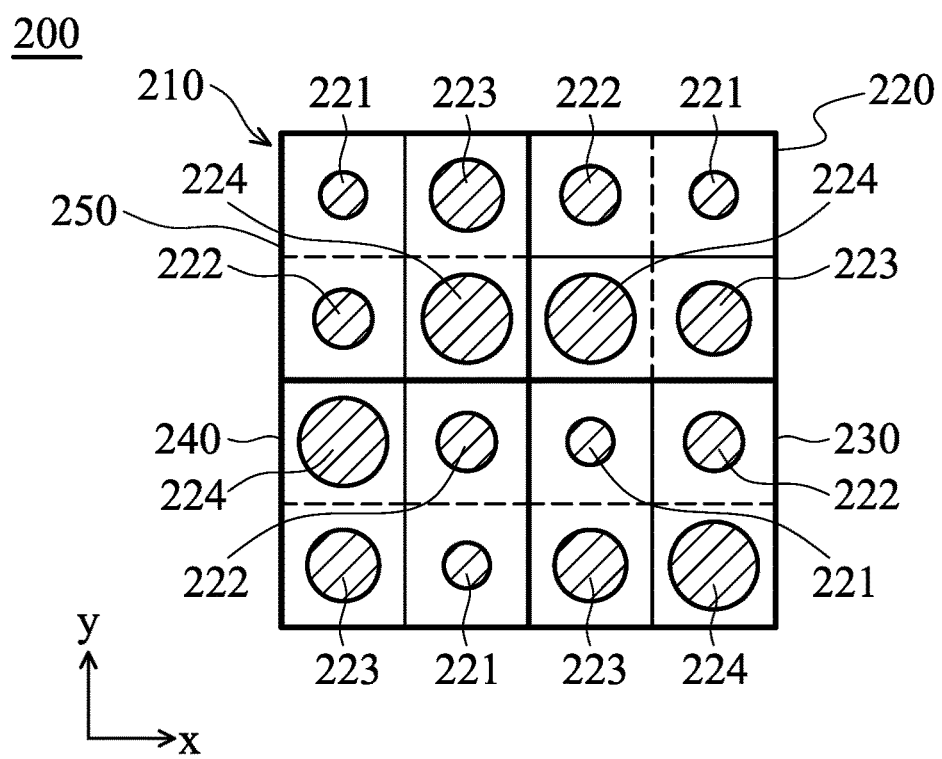
FIG. 6 is a top view of an image-sensing device according to another embodiment of the disclosure.
Figure 7:
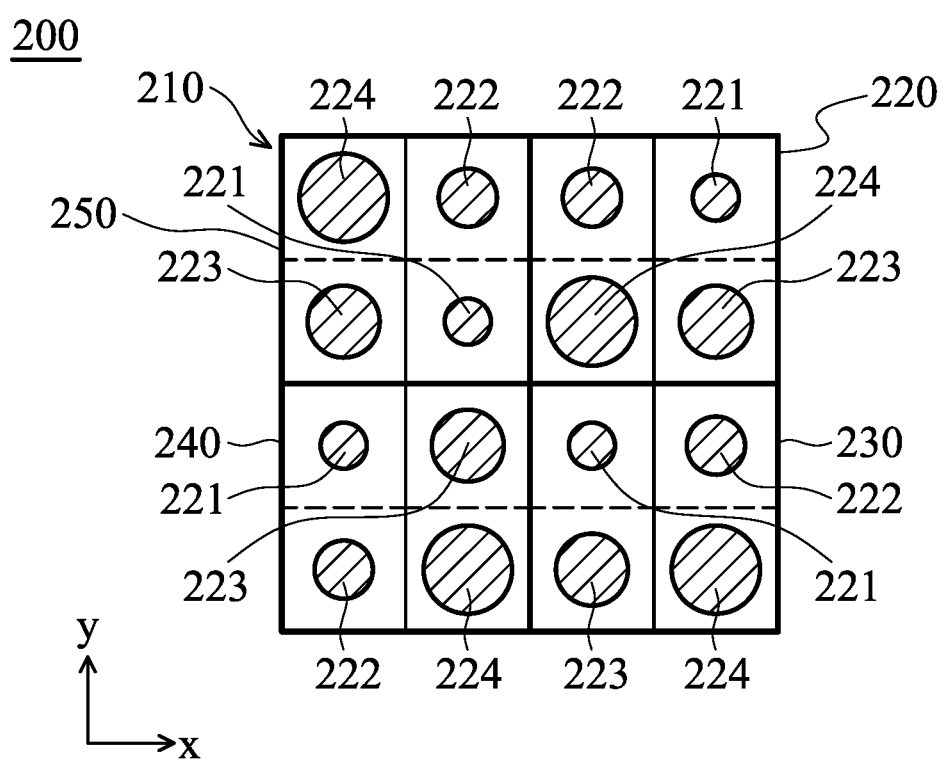
FIG. 7 is a top view of an image-sensing device according to another embodiment of the disclosure.

Alternatively, in some embodiments, each of the unit cells 220, 230, 240 and 250 is formed as a 2×2 array, an order of the first photoelectric element 221, the second photoelectric element 222, the third photoelectric element 223 and the fourth photoelectric element 224 in the 2×2 array is fixed, each of the unit cells 220, 230, 240 and 250 is repeated with a predetermined degree rotation to the right, or each of the unit cells 220, 230, 240 and 250 is repeated with a flip to the right, or each of the unit cells 220, 230, 240 and 250 is repeated with the flip and the predetermined degree rotation to the right, as shown in FIG. 5, FIG. 6 or FIG. 7. The predetermined degree may be, for example, 90 degrees, 180 degrees or 270 degrees.

It can be seen in FIG. 5, the order of the photoelectric element 221, the photoelectric element 222, the photoelectric element 223, and the photoelectric element 224 in the 2×2 array of each of the unit cells 220, 230, 240 and 250 may be fixed, the unit cell 220 is repeated with the predetermined degree (for example, 90 degrees) rotation to the right from the unit cell 250, the unit cell 250 is repeated with the predetermined degree (for example, 180 degrees) rotation to the right from the unit cell 240, the unit cell 240 is repeated with the (vertical) flip and the predetermined degree (for example, 90 degrees) rotation to the right from the unit cell 230, and the unit cell 230 is repeated with the (vertical) flip to the right the unit cell 220. Therefore, patterns formed by the unit cells 220, 230, 240 and 250 are different.

It can be seen in FIG. 6, the order of the photoelectric element 221, the photoelectric element 222, the photoelectric element 223, and the photoelectric element 224 in the 2×2 array of each of the unit cells 220, 230, 240 and 250 may be fixed, the unit cell 220 is repeated with the predetermined degree (for example, 90 degrees) rotation to the right from the unit cell 250, the unit cell 250 is repeated with the predetermined degree (for example, 180 degrees) rotation to the right from the unit cell 240, the unit cell 240 is repeated with the (horizontal) flip and the predetermined degree (for example, 90 degrees) rotation to the right from the unit cell 230, and the unit cell 230 is repeated with the (horizontal) flip to the right the unit cell 220. Therefore, patterns formed by the unit cells 220, 230, 240 and 250 are different.

It can be seen in FIG. 7, the order of the photoelectric element 221, the photoelectric element 222, the photoelectric element 223, and the photoelectric element 224 in the 2×2 array of each of the unit cells 220, 230, 240 and 250 may be fixed, the unit cell 220 is repeated with the predetermined degree (for example, 270 degrees) rotation to the right from the unit cell 250, the unit cell 250 is repeated with the predetermined degree (for example, 180 degrees) rotation to the right from the unit cell 240, the unit cell 240 is repeated with the (vertical) flip and the predetermined degree (for example, 90 degrees) rotation to the right from the unit cell 230, and the unit cell 230 is repeated with the (horizontal) flip to the right the unit cell 220. Therefore, patterns formed by the unit cells 220, 230, 240 and 250 are different. The other arrangements of the photoelectric element 221, the photoelectric element 222, the photoelectric element 223, and the photoelectric element 224 in the 2×2 array of each of the unit cells 220, 230, 240 and 250 may be refer to the embodiment of FIG. 5, FIG. 6 or FIG. 7, and the description thereof is not repeated herein.

Accordingly, the image-sensing devices 200 in FIG. 2B, FIG. 5, FIG. 6, and FIG. 7 may also achieve the same effect as the image-sensing device in FIG. 2A.

Figure 8:
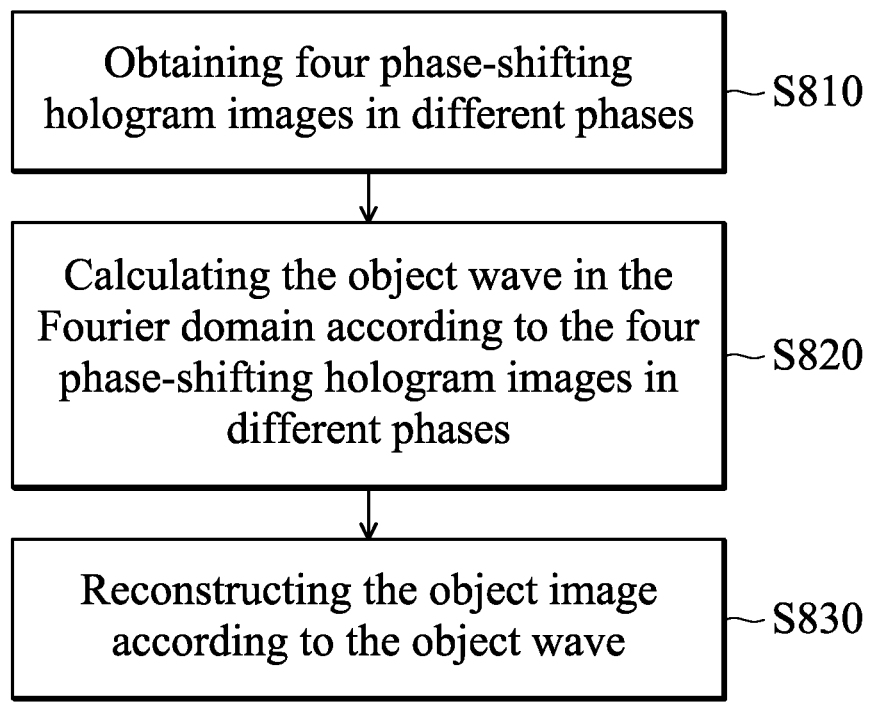
FIG. 8 is a flowchart of a 4-step phase-shifting holography method for use in an image-sensing device according to an embodiment of the disclosure.

FIG. 8 is a flowchart of a 4-step phase-shifting holography method for use in an image-sensing device according to an embodiment of the disclosure. The flowchart in FIG. 8 is for use in the image-sensing device 200 (such as the mono-color image sensor). In step S810, the method involves obtaining four phase-shifting hologram images in different phases. For example, the image-sensing device 200 shown in FIG. 2A, FIG. 2B, FIG. 5, FIG. 6 or FIG. 7 may be used in the following embodiments. Specifically, the four phase-shifting hologram images correspond to the phases 0, π/2, π, and 3π/2.

In step S820, the method involves calculating the object wave in the Fourier domain according to the four phase-shifting hologram images in different phases. For example, the intensities of the phase-shifting hologram images in different phases (such as 0, π/2, π, and 3π/2) may be calculated using formulas (1)~(4), and the object wave may be calculated using formula (5). However, to simplify the calculation of the object wave, the object wave $\varphi_0$ may be calculated approximately using the following formula (6):

$$\varphi_0 \approx (I_0 - I_\pi) - \mathfrak{f}(I_{\pi/2} - I_{3\pi/2}) \qquad (6)$$

In step S830, the method involves reconstructing the object image according to the object wave. For example, the object wave $\varphi_0$ is in the Fourier domain and the object image is in the spatial domain, and thus an inverse Fourier transform may be applied on the object wave $\varphi_0$ to reconstruct the object image. Alternatively, a transfer function H(x, y) for transforming the object wave in the Fourier domain to the object image in the spatial domain may be estimated in advance, and thus a convolution between the object wave and the transfer function may be performed to obtain the object image.

Figure 9:
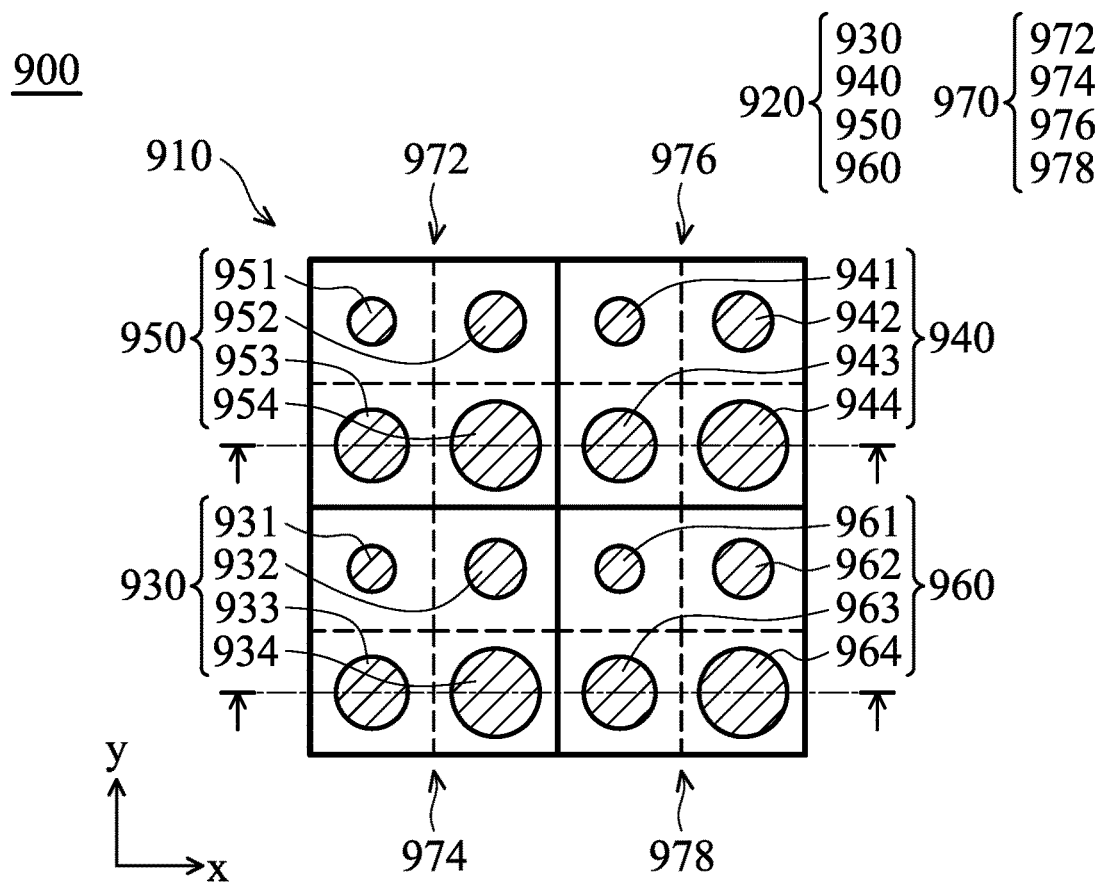
FIG. 9 is a top view of an image-sensing device according to another embodiment of the disclosure.
Figure 10:
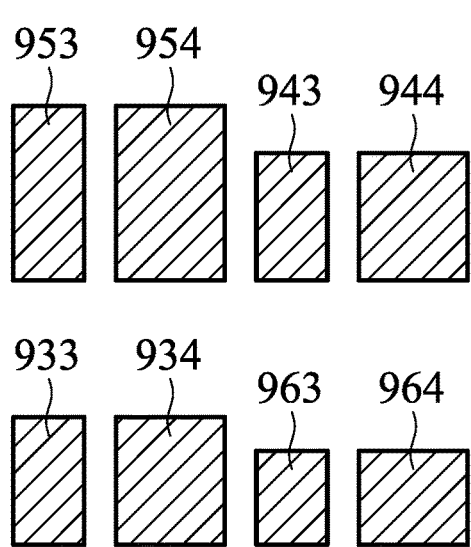
FIG. 10 is a cross-sectional view of the image-sensing device in FIG. 9.

FIG. 9 is a top view of an image-sensing device according to another embodiment of the disclosure. FIG. 10 is a cross-sectional view of the image-sensing device in FIG. 9. In the embodiment, the image-sensing device 900 is, for example, a color image sensor. Please refer to FIG. 9 and FIG. 10. The image-sensing device 900 may include a sensor array 910 and a filter array 970.

The sensor array 910 includes a plurality of photoelectric elements for receiving incident light. In the sensor array 910, the photoelectric elements are arranged into a plurality of unit cells 930, 940, 950 and 960. For example, the unit cell 930 (such as a first unit cell) includes a photoelectric element 931, a photoelectric element 932, a photoelectric element 933 and a photoelectric element 934. The unit cell 940 (such as a second unit cell) includes a photoelectric element 941, a photoelectric element 942, a photoelectric element 943 and a photoelectric element 944. The unit cell 950 (such as a third unit cell) includes a photoelectric element 951, a photoelectric element 952, a photoelectric element 953 and a photoelectric element 954. The unit cell 960 (such as a fourth unit cell) includes a photoelectric element 961, a photoelectric element 962, a photoelectric element 963 and a photoelectric element 964.

In the embodiment, the photoelectric elements 931~934, the photoelectric elements 941~944, the photoelectric elements 951~954 and the photoelectric elements 961~964 may be arranged into a 2×2 array, respectively. The photoelectric elements 931~934, the photoelectric elements 941~944, the photoelectric elements 951~954 and the photoelectric elements 961~964 are equal to or similar to the photoelectric elements 221~224 in FIG. 2A. Accordingly, the photoelectric elements 931~934, the photoelectric elements 941~944, the photoelectric elements 951~954 and the photoelectric elements 961~964 may refer to the embodiments in FIGS. 2A-6, and the description thereof is not repeated herein.

In addition, the unit cells 930, 940, 950 and 960 are arranged into a plurality of macro unit cells 920. For example, each of the macro unit cells 920 may include the unit cell 930, the unit cell 940, the unit cell 950 and the unit cell 960. In the embodiment, the unit cell 930, the unit cell 940, the unit cell 950 and the unit cell 960 may be arranged into a 2×2 array.

The filter array 970 is disposed on the photoelectric elements, i.e., the filter array 970 is disposed on the sensor array 910. In addition, the filter array 970 may include a plurality of color filters, such as red filters 972, green filters 974 and 976, and blue filters 978. For example, two green filters 974 and 976, one red filter 972, and one blue filter 978 are arranged into a 2×2 array. In the embodiment, the green filters 974 and 976 may extract green light from the incident light, the red filter 972 may extract red light from the incident light, and the blue filter 978 may extract blue light from the incident light.

The sensor array 910 may receive the incident light via the filter array 970. The unit cell 930 may correspond to the green filter 974 in the filter array 970, the unit cell 940 may correspond to the green filter 976 in the filter array 970, the unit cell 950 may correspond to the red filter 972 in the filter array 970, and the unit cell 960 may correspond to the blue filter 978 in the filter array 970. Thus, the unit cells 930, 940, 950, and 960 in each of the macro unit cells 920 may receive the green light, the green light, the red light and the blue light via the green filter 974, the green filter 976, the red filter 972 and the blue filter 978 in the filter array 910, respectively. Specifically, the four unit cells 930, 940, 950, and 960 in each of the macro unit cell 920 are configured to capture green, blue, red, and green images in four different phases, such as 0, $\pi/2$, $\pi$, and $3\pi/2$.

Given that $H\zeta_r$, $H\zeta_g$, and $H\zeta_b$ represent the wavelengths of the red light, green light, and blue light respectively, it can be concluded that the relationship between the wavelengths is $H\zeta_r > H\zeta_g > H\zeta_b$, since the red light has the longest wavelength and the blue light has the shortest wavelength among red, green, and blue lights. Accordingly, assuming that the photoelectric elements in the sensor array 910 are made of the same material, the photoelectric elements 951~954 in the unit cell 950 for receiving the red light have relatively greater heights than the photoelectric elements in other unit cells in the macro unit cell 920. That is, the heights of the photoelectric elements in each unit cell are proportional to the wavelength of the received light.

For example, the heights of the photoelectric elements 951~954 in the unit cell 950 (corresponding to the red filter 972) are higher than the heights of the photoelectric elements 931~934 and 941~944 in the unit cell 930 and the unit cell 940 (corresponding to the green filters 941 and 976), and the heights of the photoelectric element 931~934 and 941~944 in the 930 and the unit cell 940 (corresponding to the green filters 941 and 976) are higher than the heights of the photoelectric elements 961~964 in the unit cell 960, as shown in FIG. 10.

Since the macro unit cell 920 is repeatedly arranged in the sensor array 910, four phase-shifting hologram images are obtained by combining images captured by each of the unit cells 930, 940, 950, and 960 of the macro unit cells 920 in the sensor array 910, and thus total 16 phase-shifting hologram images may be obtained. It should be noted that the green phase-shifting hologram image captured by the unit cell 930 is the same as that captured by the unit cell 940. For example, the total 16 phase-shifting hologram images may be (R$\delta$0, R$\delta$1, R$\delta$2, R$\delta$3), (G1$\delta$0, G1$\delta$1, G1$\delta$2, G1$\delta$3), (G2$\delta$0, G2$\delta$1, G2$\delta$2, G2$\delta$3), and (B$\delta$0, B$\delta$1, B$\delta$2, B$\delta$3), wherein the green phase-shifting hologram images (G1$\delta$0, G1$\delta$1, G1$\delta$2, G1$\delta$3) are captured by the unit cell 930, and the green phase-shifting hologram images (G2$\delta$0, G2$\delta$1, G2$\delta$2, G2$\delta$3) are captured by the unit cell 940.

Figure 11:
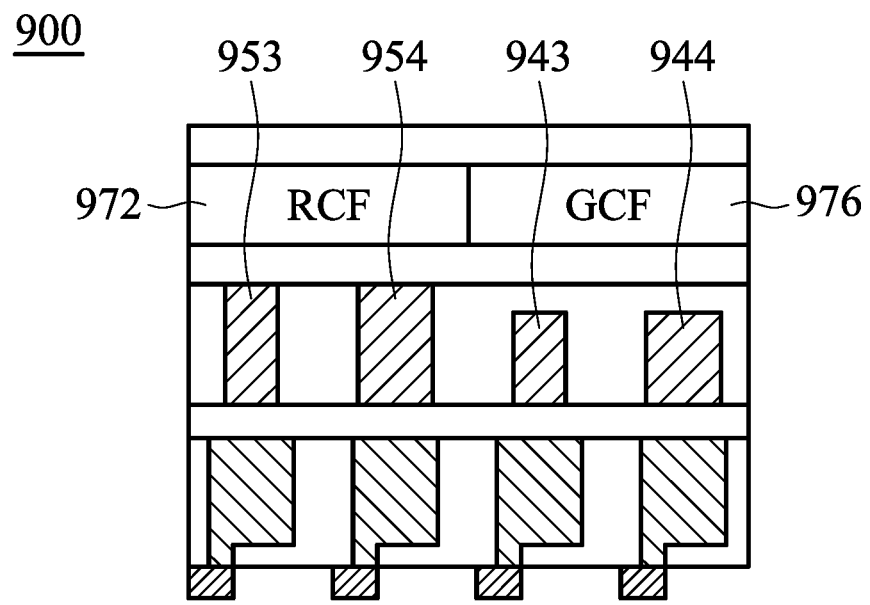
FIG. 11 is another cross-sectional view of the image-sensing device in FIG. 9.

In one embodiment, the green filter 974 and the green filter 976 are respectively formed of a green color filter (for example, "GCF" in FIG. 11), the red filter 972 is formed of a red color filter (for example, "RCF" in FIG. 11), and the blue filter 978 is formed of a blue color filter, as shown in FIG. 11.

Figure 12:
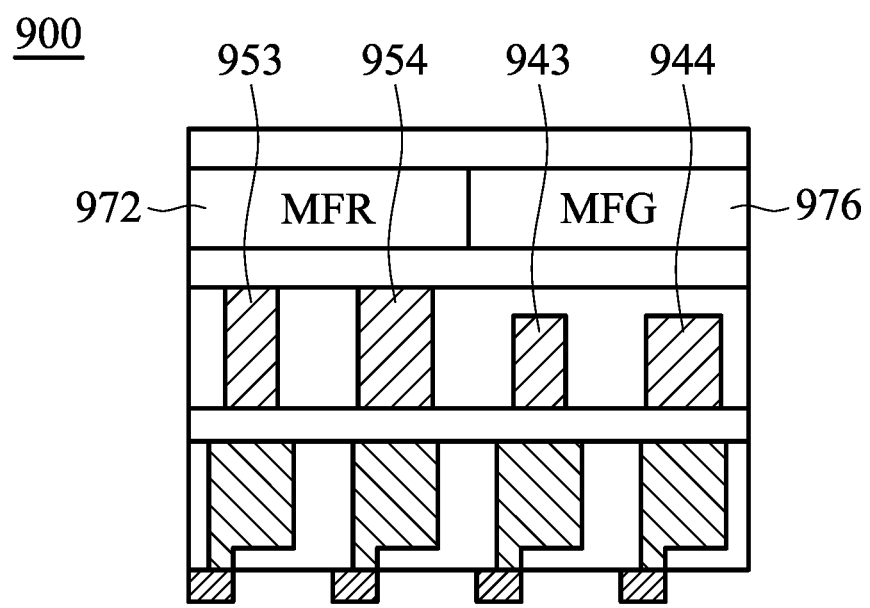
FIG. 12 is another cross-sectional view of the image-sensing device in FIG. 9.

In one embodiment, the green filter 974 and the green filter 976 are respectively formed of a green multi-film (for example, "MFG" in FIG. 12), the red filter 972 is formed of a red multi-film (for example, "MFR" in FIG. 12), and the blue filter 978 is formed of a blue multi-film, as shown in FIG. 12.

Figure 13:
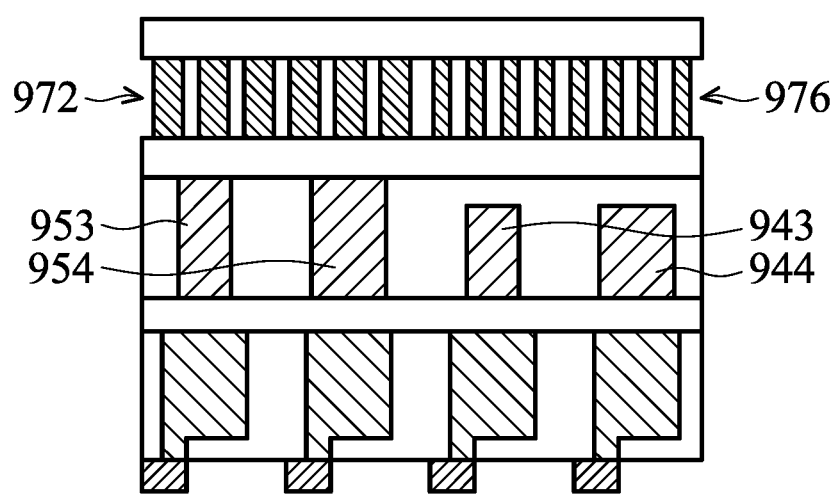
FIG. 13 is another cross-sectional view of the image-sensing device in FIG. 9.

In one embodiment, the green filter 974 and the green filter 976 are respectively formed of a green grating, the red filter 972 is formed of a red grating, and the blue filter 978 is formed of a blue grating, as shown in FIG. 13.

Figure 14:
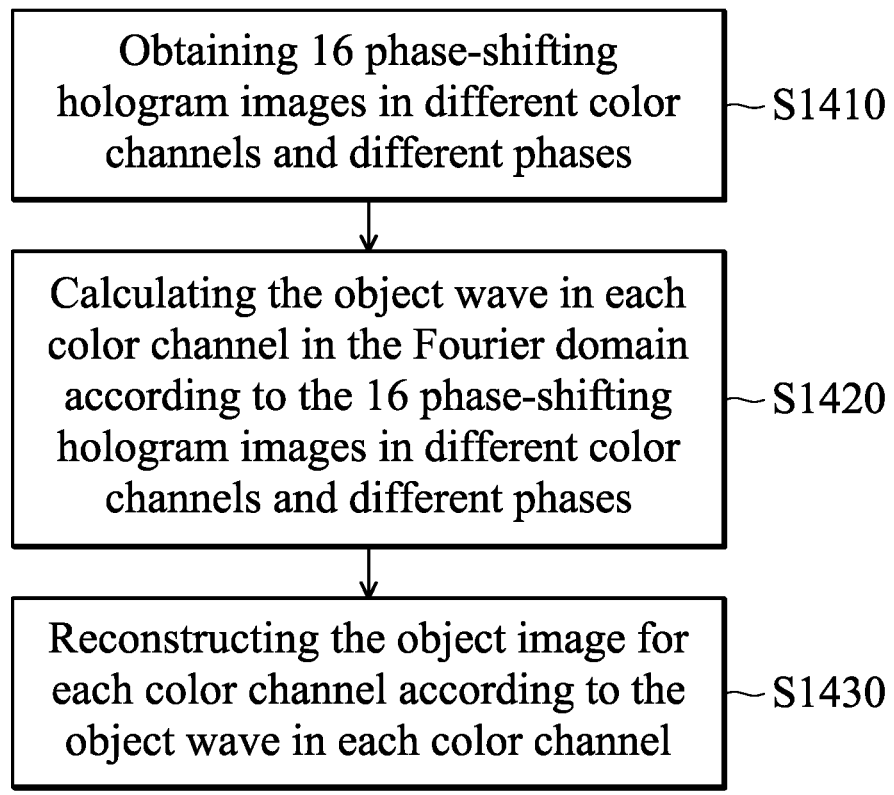
FIG. 14 is a flowchart of a 4-step phase-shifting holography method for use in an image-sensing device according to another embodiment of the disclosure.

FIG. 14 is a flowchart of a 4-step phase-shifting holography method for use in an image-sensing device according to an embodiment of the disclosure. The flowchart in FIG. 14 is for use in the image-sensing device 900 (such as the color image sensor). In step S1410, the method involves obtaining 16 phase-shifting hologram images in different color channels and different phases. For example, the image-sensing device 900 in FIG. 9 may be used in the following embodiments. The 16 phase-shifting hologram images are (R$\delta$0, R$\oplus$1, R$\delta$2, R$\delta$3), (G1$\delta$0, G1$\delta$1, G1$\delta$2, G1$\delta$3), (B$\delta$0, BM, B$\delta$2, B$\delta$3), and (G2$\delta$0, G2$\delta$1, G2$\delta$2, G2$\delta$3), as described above. The above color channels may correspond to the unit cells 930, 940, 950 and 960, respectively.

In step S1420, the method involving calculating the object wave in each color channel in the Fourier domain according to the 16 phase-shifting hologram images in different color channels and different phases.

In step S1430, the method involving reconstructing the object image for each color channel according to the object wave in each color channel. Specifically, there are four color channels such as one red channel, one blue channel, and two green channels for the image-sensing device 900 (such as the color image sensor), and the operations for calculating the object wave and reconstructing the object image in a single color channel may be referred to in the embodiment of FIG. 8, and the description thereof is not be repeated herein.

Thus, four object images representing one red channel, one blue channel, and two green channels are obtained after step S1430, and an image signal processor (not shown) coupled to the image-sensing device 900 may reconstruct the original color image using the four object images.

In summary, according to the image-sensing device disclosed by the embodiment of the disclosure, the photoelectric elements in each of the unit cells are formed of pillar structures, and the photoelectric elements are different sizes. By arranging photoelectric elements with different sizes, that are designed for different phases in the 4-step phase-shifting holography algorithm, into the sensor array of the image-sensing device, the object image may be reconstructed using the phase-shifting hologram images captured by the photoelectric elements, and thus no modular lens is required in the camera module using the lens-free image sensor, and thus the cost of the whole camera module may be reduced and the thickness of the camera module may be thinner.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An image-sensing device, comprising:
   a plurality of photoelectric elements, arranged into a plurality of unit cells, and each of the unit cells comprising a first photoelectric element, a second photoelectric element, a third photoelectric element and a fourth photoelectric element;
   wherein the first photoelectric element, the second photoelectric element, the third photoelectric element and the fourth photoelectric element in each of the unit cells are formed of pillar structures and have different sizes;
   wherein the first photoelectric element captures a first image in a first phase, the second photoelectric element captures a second image in a second phase, the third photoelectric element captures a third image in a third phase, the fourth photoelectric element captures a fourth image in a fourth phase;
   wherein the first phase, the second phase, the third phase, and the fourth phase are different;
   wherein each of the unit cells is formed as a 2×2 array, an order of the first photoelectric element, the second photoelectric element, the third photoelectric element and the fourth photoelectric element in the 2×2 array is fixed, and each of the unit cells is repeated with a predetermined degree rotation to the right, or each of the unit cells is repeated with a flip to the right, or each of the unit cells is repeated with the flip and the predetermined degree rotation to the right.

2. The image-sensing device as claimed in claim 1, wherein materials of the pillar structures are single crystal silicon, polycrystalline silicon (poly Si), amorphous silicon, Si3N4, GaP, TiO2, AlSb, AlAs, AlGaAs, AlGaInP, BP, ZnGeP2, or a combination thereof.

3. The image-sensing device as claimed in claim 1, wherein an order of each of the unit cells is fixed.

4. An image-sensing device, comprising:
   a plurality of photoelectric elements, arranged into a plurality of unit cells, and each of the unit cells comprising a first photoelectric element, a second photoelectric element, a third photoelectric element and a fourth photoelectric element;
   wherein the first photoelectric element, the second photoelectric element, the third photoelectric element and the fourth photoelectric element in each of the unit cells are formed of pillar structures and have different sizes;
   wherein the first photoelectric element captures a first image in a first phase, the second photoelectric element captures a second image in a second phase, the third photoelectric element captures a third image in a third phase, the fourth photoelectric element captures a fourth image in a fourth phase;
   wherein the first phase, the second phase, the third phase, and the fourth phase are different;
   wherein each of the unit cells is formed as a 2×2 array, an order of the first photoelectric element, the second photoelectric element, the third photoelectric element and the fourth photoelectric element in the 2×2 array is flexible, and an order of each of the unit cells is flexible,
   wherein diameters of the first photoelectric element, the second photoelectric element, the third photoelectric element and the fourth photoelectric element are 120-350 nm, and heights of the first photoelectric element, the second photoelectric element, the third photoelectric element and the fourth photoelectric element are 300-750 nm.

5. The image-sensing device as claimed in claim 1, wherein the predetermined degree is 90 degrees, 180 degrees or 270 degrees.

6. The image-sensing device as claimed in claim 1, wherein the first phase, the second phase, the third phase, and the fourth phase are 0, $\pi/2$, $\pi$ and $3\pi/2$, respectively.

7. The image-sensing device as claimed in claim 1, wherein diameters of the first photoelectric element, the second photoelectric element, the third photoelectric element and the fourth photoelectric element are 120-350 nm, and heights of the first photoelectric element, the second photoelectric element, the third photoelectric element and the fourth photoelectric element are 300-750 nm.

8. The image-sensing device as claimed in claim 1, wherein a first phase-shifting hologram image, a second phase-shifting hologram image, a third phase-shifting hologram image, and a fourth phase-shifting hologram image are obtained by respectively combining the first image in the first phase, the second image in the second phase, the third image in the third phase, and fourth image in the fourth phase captured by the unit cells through a 4-step phase-shifting digital holography algorithm.

9. The image-sensing device as claimed in claim 8, wherein an object wave in a Fourier domain is calculated according to the first phase-shifting hologram image, the second phase-shifting hologram image, the third phase-shifting hologram image, and the fourth phase-shifting hologram image, and an object image is reconstructed by an inverse Fourier transform on the object wave.

10. The image-sensing device as claimed in claim 1, comprising:
    a filter array, disposed on the photoelectric elements, wherein the filter array comprises:
    a first green filter and a second green filter for extracting green light from an incident light;
    a red filter for extracting red light from the incident light; and
    a blue filter for extracting blue light from the incident light;
    wherein the unit cells are arranged into a plurality of macro unit cells, and each of the macro unit cells comprises a first unit cell, a second unit cell, a third unit cell, and a fourth unit cell that are arranged into a 2×2 array;

wherein the first unit cell, the second unit cell, the third unit cell, and the fourth unit cell in each of the macro unit cells receive the green light, the green light, the red light, and the blue light via the first green filter, the second green filter, the red filter and the blue filter, respectively.

11. The image-sensing device as claimed in claim 10, wherein heights of the first photoelectric element, the second photoelectric element, the third photoelectric element, and the fourth photoelectric element in the third unit cell are higher than heights of the first photoelectric element, the second photoelectric element, the third photoelectric element and the fourth photoelectric element in the first unit cell and the second unit cell, and heights of the first photoelectric element, the second photoelectric element, the third photoelectric element, and the fourth photoelectric element in the first unit cell and the second unit cell are higher than heights of the first photoelectric element, the second photoelectric element, the third photoelectric element, and the fourth photoelectric element in the fourth unit cell.

12. The image-sensing device as claimed in claim 10, wherein a first green phase-shifting hologram image, a second green phase-shifting hologram image, a third green phase-shifting hologram image, and a fourth green phase-shifting hologram image are obtained by respectively combining first images in the first phase, second images in the second phase, third images in the third phase, and fourth images in the fourth phase captured by the first unit cells through a 4-step phase-shifting digital holography algorithm;

wherein a fifth green phase-shifting hologram image, a sixth green phase-shifting hologram image, a seventh green phase-shifting hologram image, and an eighth green phase-shifting hologram image are obtained by respectively combining the first images in the first phase, the second images in the second phase, the third images in the third phase, and the fourth images in the fourth phase captured by the second unit cells through the 4-step phase-shifting digital holography algorithm;

wherein a first red phase-shifting hologram image, a second red phase-shifting hologram image, a third red phase-shifting hologram image, and a fourth red phase-shifting hologram image are obtained by respectively combining the first images in the first phase, the second images in the second phase, the third images in the third phase, and the fourth images in the fourth phase captured by the third unit cells through the 4-step phase-shifting digital holography algorithm;

wherein a first blue phase-shifting hologram image, a second blue phase-shifting hologram image, a third blue phase-shifting hologram image, and a fourth blue phase-shifting hologram image are obtained by respectively combining the first images in the first phase, the second images in the second phase, the third images in the third phase, and the fourth images in the fourth phase captured by the third unit cells through the 4-step phase-shifting digital holography algorithm.

13. The image-sensing device as claimed in claim 12, wherein a first green object wave in a Fourier domain is calculated according to the first green phase-shifting hologram image, the second green phase-shifting hologram image, the third green phase-shifting hologram image and the fourth green phase-shifting hologram image;

wherein a second green object wave in the Fourier domain is calculated according to the fifth green phase-shifting hologram image, the sixth green phase-shifting hologram image, the seventh green phase-shifting hologram image and the eighth green phase-shifting hologram image;

wherein a red object wave in the Fourier domain is calculated according to the first red phase-shifting hologram image, the second red phase-shifting hologram image, the third red phase-shifting hologram image and the fourth red phase-shifting hologram image;

wherein a blue object wave in the Fourier domain is calculated according to the first blue phase-shifting hologram image, the second blue phase-shifting hologram image, the third blue phase-shifting hologram image and the fourth blue phase-shifting hologram image;

wherein a first green object image is reconstructed by applying an inverse Fourier transform on the first green object wave, a second green object image is reconstructed by applying the inverse Fourier transform on the second green object wave, a red object image is reconstructed by applying the inverse Fourier transform on the red object wave, and a blue object image is reconstructed by applying the inverse Fourier transform on the blue object wave.

14. The image-sensing device as claimed in claim 13, wherein a color image is obtained according to the first green object image, the second green object image, the red object image, and the blue object image.

15. The image-sensing device as claimed in claim 10, wherein the first green filter and the second green filter are respectively formed of a green color filter, a green multi-film or a green grating, the red filter is formed of a red color filter, a red multi-film or a red grating, and the blue filter is formed of a blue color filter, a blue multi-film or a blue grating.

* * * * *